United States Patent
Shima

(10) Patent No.: US 6,831,508 B2
(45) Date of Patent: Dec. 14, 2004

(54) SWITCHING POWER AMPLIFIER, AND SWITCHING CONTROL METHOD FOR A SWITCHING POWER AMPLIFIER

(75) Inventor: Takashi Shima, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/257,421

(22) PCT Filed: Feb. 8, 2002

(86) PCT No.: PCT/JP02/01089
§ 371 (c)(1),
(2), (4) Date: May 8, 2003

(87) PCT Pub. No.: WO02/067416
PCT Pub. Date: Aug. 29, 2002

(65) Prior Publication Data
US 2003/0169103 A1 Sep. 11, 2003

(30) Foreign Application Priority Data
Feb. 19, 2001 (JP) ........................................ 2001-042105

(51) Int. Cl.[7] .............................. H03F 3/38; H03F 3/217

(52) U.S. Cl. ........................... 330/10; 330/251; 330/297
(58) Field of Search ................................ 330/10, 207 A, 330/251, 297

(56) References Cited

U.S. PATENT DOCUMENTS 6,084,450 A * 7/2000 Smith et al. ................. 327/172

* cited by examiner

Primary Examiner—Steven J. Mottola
(74) Attorney, Agent, or Firm—Jay H. Maioli

(57) ABSTRACT

A reduction is made in signal distortion that occurs in an output signal of a PWM switching power amplifier due to noise disturbances from a switching power supply. In a switching power amplifier that has a switching power supply unit, a clock signal for controlling the switching of the switching power supply unit is generated based on a clock signal that is used to synchronize switching operations. The clock signal has a clock period that is an integer multiple of a period t of the clock signal and matches a timing at which a signal level of a PWM power signal that is generated by the switching power amplifier is at ground level. The switching of the switching power supply unit is synchronized using the clock signal.

23 Claims, 8 Drawing Sheets

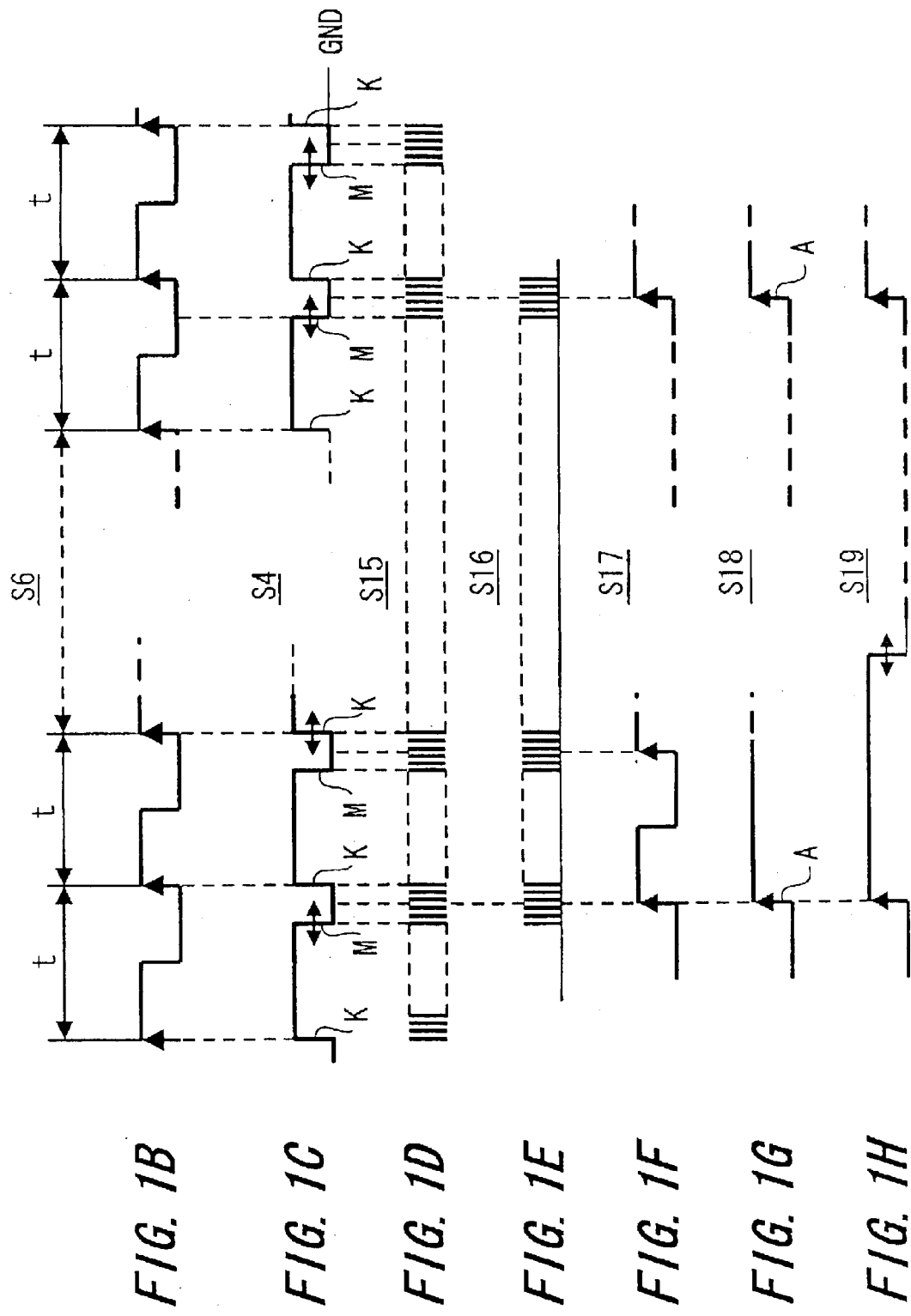

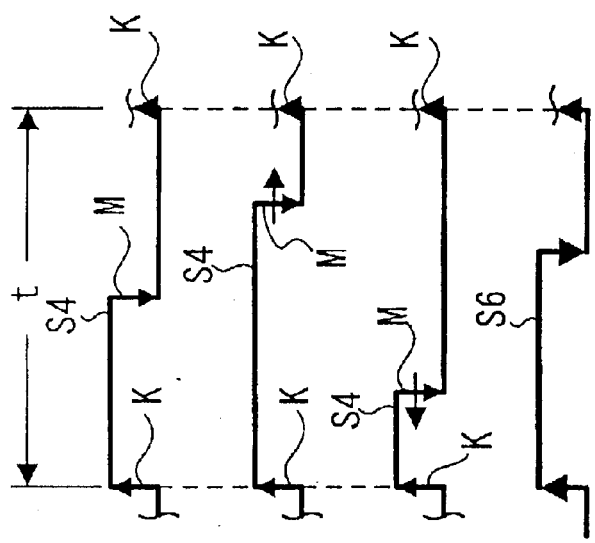
FIG. 2A
FIG. 2B
FIG. 2C
FIG. 2D
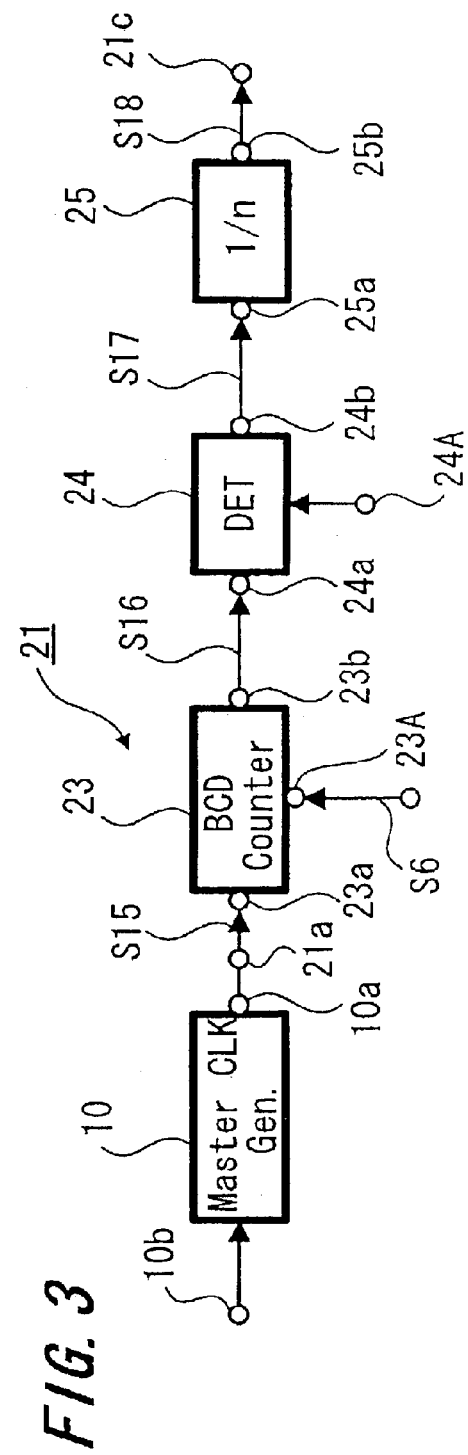
FIG. 3

SWITCHING POWER AMPLIFIER, AND SWITCHING CONTROL METHOD FOR A SWITCHING POWER AMPLIFIER

TECHNICAL FIELD

The present invention relates to a switching power amplifier and a switching control method for a switching power amplifier, and particularly to a switching power amplifier and a switching power control method for the switching power amplifier suitable for being applied to the purpose of minimizing the effects of the noise generated by the switching power supply on the power amplifier stage in the switching power amplifier having a switching supply unit as a power source.

BACKGROUND ART

Signal amplifiers that are usually referred to as "class D-operation amplifiers" are conventionally known as one type of power amplifier. A typical example of a class D-operation amplifier is shown in FIG. 7A. In the illustrated power amplifier, an analog signal S1 inputted into a signal input terminal 1 is subjected to pulse width modulation by a pulse width modulation amplifier 2. This pulse width modulation amplifier 2 generates a PWM (pulse width modulation) signal S2, in which the changes in the signal level of the analog signal S1 are expressed as changes in the pulse width direction, and also a PWM signal S3 with a waveform that is in a phase inversion relationship with the PWM signal S2.

It should be noted that in the following explanation, the waveform of the PWM signal S3 is in a phase inversion relationship with the waveform of the PWM signal S2, so that these signals have a complementary relationship whereby when one of the signal waveforms of the PWM signal S2 and S3 is positive, the signal waveform of the other signal is negative.

It is also conventionally known that the power efficiency of class D-operation amplifiers is high, but to further increase the power efficiency of a power amplifier as a whole, it is conceivable to use a switching power supply circuit as the power supply. In FIG. 7A, numeral 10 is a clock with a fixed cycle period t, so that the PWM signal S2 and the PWM signal S3 that are based on the changes in the signal level of the analog signal S1 are respectively generated and outputted by the pulse width modulation amplifier 2 as signals that are repeatedly produced in periods of t. It should be noted that the signal phase relationship between the PWM signal S2 and the PWM signal S3 is as described above, so that the signals have complementary characteristics whereby the signal phase of the PWM signal S2 is in an inverse relationship with the signal phase of the PWM signal S3.

A DC voltage that has been stabilized at a preset fixed output voltage is generated by the switching power supply unit 11 and a positive DC voltage is supplied from the positive DC power supply terminal +Vcc of the switching power supply unit 11 to the power switching circuit 3. It should be noted that the negative DC power supply terminal of the switching power supply unit 11 is grounded via an earth terminal 12. A class D-operation amplifier differs from the example amplifier shown in FIG. 7A, in that it is composed as an amplifier with a positive/negative power supply, -Vcc is also outputted, and a neutral point between +Vcc and -Vcc is grounded.

In the power switching circuit 3, the source of a first N-channel power MOSFET 4 (referred to hereafter as the "first power FET 4") is connected to the drain of a second N-channel power MOSFET 5 (referred to hereafter as the "second power FET 5"), with the drain of the first power FET 4 being connected to the positive DC power supply terminal +Vcc of the switching power supply unit 11 and the source of the second power FET 5 being connected to ground.

A circuit that is constructed in this way of the first power FET 4 and the second power FET 5 is normally referred to as a "half bridge circuit". Also, as shown in FIG. 7A, a pre-driver 28 is used as a half bridge driver that drives a half bridge circuit with the above construction. As one example, the pre-driver HIB2001B (registered trademark) that is manufactured by Intersil Corporation as a motor pre-driver can be used as this pre-driver 28.

Via this pre-driver 28, the PWM signal S2 is converted into a signal S7 that can perform an ON/OFF driving of the first power FET 4, and the PWM signal S3 is converted into a signal S8 that can perform an ON/OFF driving of the second power FET 5. The first power FET 4 is driven by the signal S7 and the second power is driven by the signal S8, so that the first power FET 4 and the second power FET 5 are alternately switched ON and OFF by the PWM signals S7 and S8. A PWM signal S4 that switches in accordance with changes in the pulse width direction of the PWM signals S7 and S8 is generated and is outputted from between a connecting point located between the source of the first power FET 4 and the drain of the second power FET 5 and the earth connection.

After the PWM signal S4 passes through a high frequency band-blocking power filter unit (hereafter referred to as the LPF (low pass filter) unit) 6 composed of a coil 7 and a capacitor 8, and then through a capacitor 13 for removing the DC component, an analog power signal S5 that reflects the changes in the signal level of the analog signal S1 within the band of audible frequencies is demodulated from the PWM power signal S4. The demodulated analog power signal S5 is supplied to the speaker unit 9, where the analog power signal S5 is reproduced as an audio signal.

FIG. 7B shows several one-sided PWM-modulated waveforms as representative examples of the PWM-modulated waveform of the PWM signal S4. It should be noted that the name "one-sided PWM-modulated waveform" is used since both end edges (shown as "K" in FIG. 7B) of the PWM-modulated waveforms are fixed by locking them at the cycle period t of the clock signal S6, and a movable edge (M), which is a falling edge of the PWM-modulated waveform generated between both end edges of a fixed PWM-modulated waveform, is position-modulated in accordance with the signal level of the analog signal S1. Such PWM modulated waveforms are continuously generated one after the other.

It should be noted that other examples of one-sided PWM-modulated waveforms are also known. Such PWM-modulated waveforms are continuously generated with both of the fixed end edges of the PWM-modulated waveforms that are locked at the cycle period t of the clock signal S6 being falling edges, and the rising edge of the PWM-modulated waveform that is generated between the two fixed edges of the PWM-modulated waveform being position-modulated in accordance with changes in the signal level of the analog signal S1.

It should be noted that in the following explanation, the edges in the waveform of the PWM signal S4 that are locked by the clock signal S6 at the timing determined by the cycle period t of the clock signal S6 are referred to as the "fixed edges" of the PWM signal S4. As examples, in parts 1B, 2B, and 3B of FIG. 7B, the waveform edges illustrated using upward-pointing arrows correspond to these fixed edges. Also, in the waveform of the PWM signal S4, the edge whose position changes in accordance with the signal level of the analog signal S1 is referred to as the "movable edge M". As examples, the waveform edges of the PWM signal S4 that are shown by horizontal-pointing arrows in parts 2B, and 3B of FIG. 7B, correspond to movable edges M.

In the following explanation, out of the fixed edges, the edge that precedes the movable edge M is referred to as the "starting edge". In the example shown in FIG. 7B, out of the two fixed edges K of the PWM-modulated waveform, the former fixed edge K, which is locked by the first waveform edge in the waveform of the clock signal S6 as shown by the upward-pointing arrow (see part 4B in FIG. 7B), is the starting edge.

In the present example of one-sided PWM-modulated waveforms, the signal waveform of the PWM power signal S4 at a point when the signal level of the analog signal S1 is zero becomes a PWM-signal waveform with a duty ratio of 50%, as shown in part 1B of FIG. 7B. The waveform of the PWM power signal S4 when the signal level of the analog signal S1 has changed from zero in the direction where positive values increase is as shown in part 2B of FIG. 7B, with the width of the part of the waveform of the PWM power signal S4 that is located between the fixed edge K that is the starting edge and the movable edge M increasing together with this change in the signal level. Conversely, when the signal level of the analog signal S1 has changed from zero in the direction where negative values increase, the waveform of the PWM power signal S4 is as shown in part 3B of FIG. 7B, with the width of the part of the waveform of the PWM power signal S4 that is located between the fixed edge K that is the starting edge and the movable edge M decreasing together with this change in the signal level.

In more detail, changes in the area that is expressed by the waveform of the PWM power signal S4 represent the changes in the signal level of the analog signal S1. Accordingly, if the changes in the area that is expressed by the waveform of the PWM power signal S4 are not correctly proportional to the changes in the waveform area between the fixed edge K and the movable edge M that are expressed by waveforms of the PWM signals S2 and S3, which is to say, when there is a proportion error, there is the problem of this error appearing as signal waveform distortion of the analog power signal S5.

FIG. 8A is a block diagram showing the principal parts of the construction of a conventional switching power supply unit 11. As shown in the drawing, the switching power supply unit 11 includes an AC power supply unit 14, a transformer 14A, a PWM switching unit 15, a rectification unit 16, a voltage error detecting unit 17, a reference voltage generating unit 18, a clock signal generating unit 19, and a switching unit 20.

One AC voltage output terminal that is provided on the AC power supply unit 14 for outputting the AC voltage S10 is connected to one end of the input coil of the transformer 14A, while the other end of the input coil is connected via the switching unit 20 to the other AC voltage output terminal that is provided on the AC power supply unit 14 for the AC voltage S10. The output coil of the transformer 14A is connected to the inputs of the rectification unit 16, with the DC voltage output terminals of the rectification unit 16 being respectively connected to the DC voltage output terminals 16A and 16B so that a DC voltage is outputted from these output terminals 16A and 16B. It should be noted that of the output terminals 16A and 16B, the output terminal 16A is the positive output terminal +Vcc for the DC voltage, while the output terminal 16B is the ground level output terminal.

In the above switching power supply unit 11, the DC voltage output side of the rectification unit 16 is inputted into the error detection input of the voltage error detecting unit 17, with a reference voltage 18A that has been generated by the reference voltage generating unit 18 being inputted into the reference voltage input of the voltage error detecting unit 17. The voltage error detecting unit 17 compares the voltage of the DC voltage output with the reference voltage 18A and generates an error voltage 18B, with this error voltage 18B being supplied to the error voltage input of the PWM control unit 15.

The power PWM control unit 15 generates a PWM signal with fixed edges that are locked by every period of the power supply clock signal S9, the PWM signal having been generated by the clock signal generating unit 19 and inputted to the clock signal input terminal of the power PWM control unit 15. When generating this PWM signal S19, the power PWM control unit 15 controls, based on the error voltage 18B, the position of the movable edge in a direction in which the error voltage 18B is to be suppressed.

The PWM signal S19 is supplied to the switching unit 20 and the ratio between the ON period and the OFF period of the switching by the switching unit 20 is controlled based on the position of the movable edge of the PWM signal S19. Accordingly, the DC voltage outputted from the output terminals 16A and 16B is supplied as described earlier to the switching circuit 3 with the voltage of the DC voltage outputted from the output terminals 16A and 16B being maintained at a preset voltage level.

On the other hand, in the switching power amplifier with a class D-operation amplifier construction as shown in FIG. 7A, when a switching operation by the switching power supply unit 11 results in a switching noise signal shown as "SN" in part 1D of FIG. 8B being generated while the state of the PWM power signal S4 is "ON" as shown in FIG. 8B, the switching noise signal SN is transmitted to the power switching circuit 3 of the class D-operation amplifier, so that there is the possibility of this switching noise signal SN being superimposed on the PWM power signal S4 as shown by part 2D in FIG. 8B.

When the switching noise signal SN is superimposed on the PWM power signal S4, there is a change in the area between the fixed edge that is the starting edge and the movable edge in the pulse signal during which the level of the PWM power signal S4 is high, which as described earlier results in a proportion error being produced. This causes the problem that waveform distortion occurs in the analog power signal S5 in the audible frequency band that is demodulated from this PWM power signal S4.

It should be noted that as shown in FIG. 7, the source of the second power FET 5 is connected to ground, so that when the second power FET 5 is turned on by the signal S8, the PWM power signal S4 is fixed at the ground level. In cases where the switching power supply unit 11 is embedded on a printed circuit board, the entire surface on the opposite side of the printed circuit board on which the switching power supply unit 11 is embedded is composed of a conductor layer at the ground level (that is to say, a wide ground plane), so that the reactance between the source of the second power and the ground level becomes as close as possible to zero. Accordingly, when the PWM power signal S4 is at a low level, the generation of switching noise can be sufficiently suppressed, as shown by the symbol G in part 2D of FIG. 8B.

On the switching power supply unit 11 side also, the reactance value to the ground becomes as a close as possible to zero, so that it is possible to suppress noise that leaks from the ground side. However, there remains the problem that in order to suppress the distortion component in the PWM power signal S4, it has been difficult to sufficiently suppress the switching noise that is generated by the switching unit 20 when the switching unit 20 of the switching power supply unit 11 switches from OFF to ON so as to prevent the switching noise from being superimposed on the output of the rectification unit 16.

SUMMARY OF THE INVENTION

The present invention was conceived in view of the problem with the related art described above, and has an object of solving the problem by controlling a switching power supply unit that supplies power to a power switching unit, whose switching is controlled by a PWM signal that is generated based on changes in a signal level of an input signal S1, so that a clock signal used as a reference for the timing of switching operations from an OFF state to an ON state is generated during a period during which there is no effect on a PWM power signal that is outputted by the power switching unit and supplied to the load.

A switching power amplifier according to the present invention is equipped with a switching power supply unit and includes: a PWM (pulse width modulation) converting unit for performing a conversion of an input signal into a PWM signal; a PWM clock signal generating unit for generating a first clock signal that has a reference period for the conversion into the PWM signal and supplying the first clock signal to the PWM converting unit ;a power switching unit which is supplied power by the switching power supply unit and whose switching is controlled by the PWM signal; and a power supply clock signal generating unit for generating a second clock signal that has a reference period for switching operations of the switching power supply unit and supplying the second clock signal to the switching power supply unit, wherein a starting edge of the second clock signal that is generated by the power supply clock signal generating unit is formed during a period between a movable edge of the PWM signal and a fixed edge that follows the movable edge.

A switching control method according to the present invention is a switching control method for a switching power amplifier that is equipped with a switching power supply unit, and includes a step of controlling a clock signal, which has a reference period for switching operations of the switching power supply unit, so that a starting edge of the clock signal is formed between a movable edge of a PWM signal formed in accordance with an input signal and a fixed edge of the PWM signal that follows the movable edge.

Another switching power amplifier according to the present invention is a switching power amplifier that is equipped with a switching power supply unit and includes: a PWM converting unit for performing a conversion of an input signal into a first PWM signal and a second PWM signal, the first PWM signal and the second PWM signal being a two's complement of each other; a PWM clock signal generating unit for generating a first clock signal that has a reference period for the conversion into the first PWM signal and the second PWM signal and supplying the first clock signal to the PWM converting unit; a first power switching unit whose switching is controlled by the first PWM signal; a second power switching unit whose switching is controlled by the second PWM signal; a switching power supply unit for supplying power to the first power switching unit and the second power switching unit; and a power supply clock signal generating unit for generating a second clock signal that has a reference period for switching operations of the switching power supply unit and supplying the second clock signal to the switching power supply unit, wherein a starting edge of the second clock signal that is generated by the power supply clock signal generating unit is formed during a period where the first PWM signal and the second PWM signal have an equal potential level.

Another switching control method according to the present invention is a switching control method for a switching power amplifier that is equipped with a switching power supply unit, and includes a step of controlling a clock signal so that a starting edge of the clock signal is formed during one of: a first period between a movable edge of a first PWM signal that is formed in accordance with an input signal and a fixed edge that follows the movable edge; and a second period between a movable edge of a second PWM signal that is a two's complement of the first PWM signal and a fixed edge that precedes the movable edge.

By being composed as described above, the switching power amplifier and the switching control method for a switching power amplifier according to the present invention each control the cycle of the switching of the switching power supply unit so as to minimize the effects of switching noise of a switching power supply unit, which supplies power, on a power switching circuit of the switching power amplifier. By doing so, the waveform distortion of the PWM power signal that is generated by the power switching circuit can be suppressed, and a sufficient reduction can be made in the signal distortion component of an analog power signal that is outputted to the load based on this PWM power signal.

BRIEF DESCRIPTION OF THE DRAWINGS

FIG. 1A is a diagram showing one example of the construction of a switching power amplifier according to the present invention, while FIGS. 1B to H are diagrams that are used to explain the operation of this switching power amplifier.

FIGS. 2A to 2D are diagrams that are used to explain a switching operation by this power amplifier.

FIG. 3 is a diagram that is used to explain the construction of the power supply clock signal generator in this amplifier.

DETAILED DESCRIPTION OF THE PREFERRED EMBODIMENTS

Figure 1A:
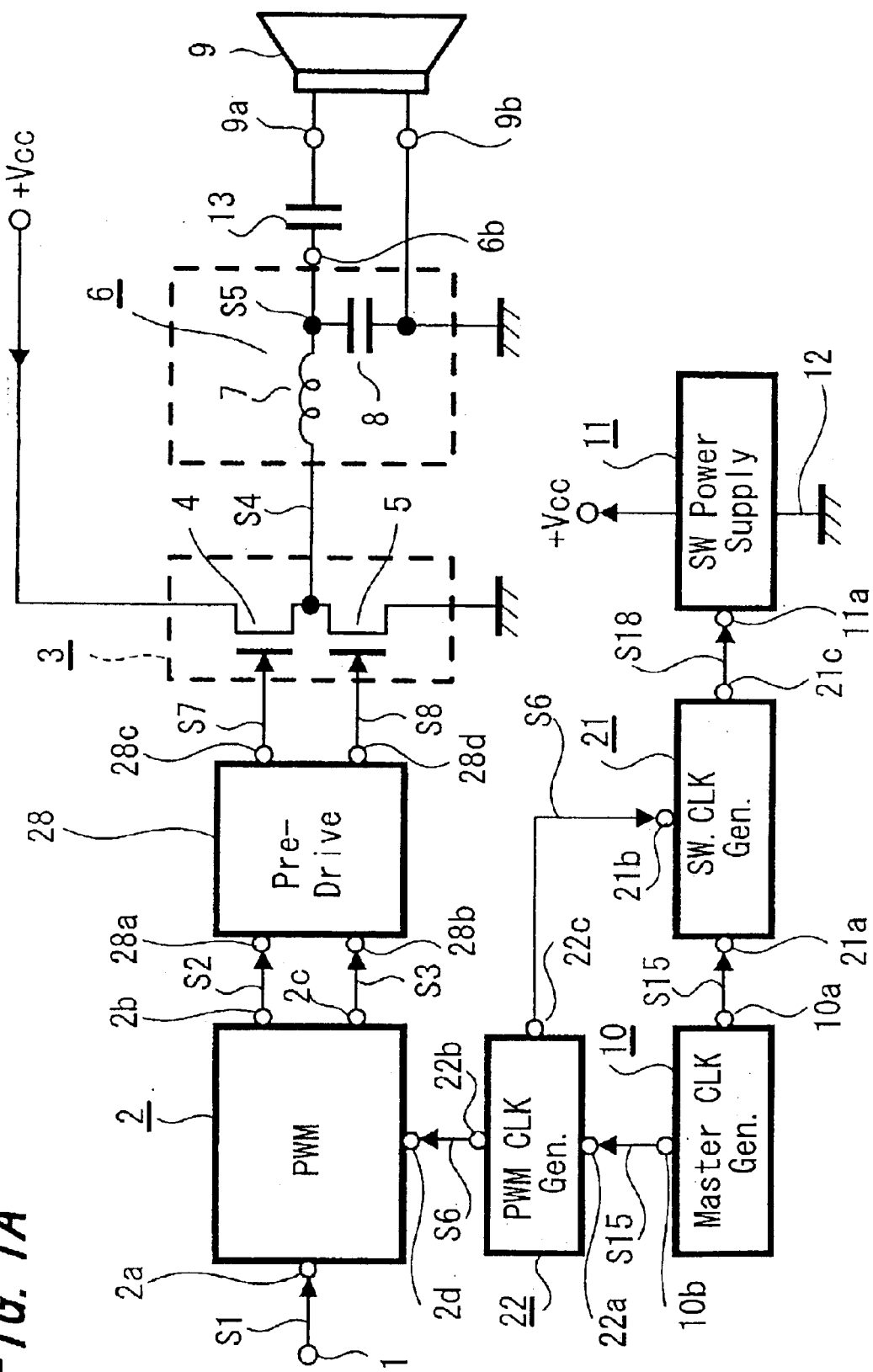

The following describes, with reference to FIG. 1A to FIG. 6, two embodiments of a switching power amplifier and a switching control method for a switching power amplifier according to the present invention. In FIG. 1A to FIG. 6, parts that are the same as in FIG. 7A to FIG. 8B have been given the same reference numerals.

First, an example of a switching power amplifier according to the present invention that has been adapted to a class D-operation amplifier is described with reference to FIG. 1A to FIG. 3.

FIG. 1A is a block diagram showing the principal parts of a switching power amplifier that is composed of a class D-operation amplifier. This switching power amplifier includes a pulse width modulation amplifier 2, a power switching circuit 3, an LPF unit 6, a speaker unit 9, a master clock signal generator 10, a switching power supply unit 11, a power supply clock signal generator 21, a PWM clock signal generator 22, and a pre-driver 28.

A signal input terminal 1 is connected to a signal input terminal 2a of the pulse width modulation amplifier 2, a first output terminal 2b of the pulse width modulation amplifier 2 is connected to a first signal input terminal 28a of the pre-driver 28, and a second output terminal 2c of the pulse width modulation amplifier 2 is connected to a second signal input terminal 28b of the pre-driver 28. A first signal output terminal 28c of the pre-driver 28 is connected to the gate of a first power FET 4 of the power switching circuit 3, and a second signal output terminal 28d of the pre-driver 28 is connected to the gate of a second power FET 5.

The +Vcc terminal of the switching power supply unit 11 is a +DC power supply output terminal, and numeral 12 is the earth terminal of the switching power supply unit 11, with the −DC power supply output side of the switching power supply unit 11 being grounded via this earth terminal 12. A signal output terminal 10a that is provided on the master clock signal generator 10 for the clock signal S15 is connected to a signal input terminal 21a of the power supply clock signal generator 21, and another signal output terminal 10b that is provided on the master clock signal generator 10 for the clock signal S15 is connected to a signal input terminal 22a of the PWM clock signal generator 22.

A signal output terminal 22b that is provided on the PWM clock signal generator 22 for a clock signal S6 with a cycle period t is connected to a signal input terminal 2d for the clock signal S6 that is provided on the pulse width modulation amplifier 2, while a signal output terminal 22c of the PWM clock signal generator 22 is connected to a signal input terminal 21b for the clock signal S6 that is provided on the power supply clock signal generator 21. A signal output terminal 21c provided on the power supply clock signal generator 21 for the clock signal S18 that is used for controlling the switching of the power supply is connected to a signal input terminal 11a of the switching power supply unit 11.

The source of the first power FET 4 of the power switching circuit 3 and the drain of the second power are FET 5 connected, with the drain of the first power FET 4 being connected to the +DC power supply output terminal +Vcc of the switching power supply unit 11 and the source of the second power FET 5 being connected to ground. A connection node between the source of the first power FET 4 of the power switching circuit 3 and the drain of the second power FET 5 is connected to an input terminal 6a of the LPF unit 6, with an output terminal 6b of the LPF unit 6 being connected, via a capacitor 13 for removing a DC component, to an input terminal 9a provided on the speaker unit 9 for a driving power signal. The other input terminal 9b of the speaker unit 9 is connected to ground.

A power switching circuit 3 that has the above construction is usually referred to as a half bridge circuit. The pre-driver 28 is provided as a half bridge driver for driving a half bridge circuit that is constructed in this way.

The LPF unit 6 is composed of a coil 7 and a capacitor 8. One end of the coil 7 is connected to an input 6a of the LPF unit 6, while the other end of the coil 7 is connected to one end of the capacitor 8. The other end of the capacitor 8 is connected to ground. A connection node between the other end of the coil 7 and the end of the capacitor 8 is connected, via an output terminal 6b of the LPF unit 6 and then via the capacitor 13 for removing a DC component to the input terminal 9a that is provided on the speaker unit 9 for the driving power signal.

The following describes the operation of this switching power amplifier.

An analog signal S1 is supplied, via the signal input terminal 2a, to the pulse width modulation amplifier 2 that is controlled in synchronization with the period t of the clock signal S6. The pulse width modulation amplifier 2 generates a PWM signal S2 and a PWM signal S3 at timing that is synchronized with repeated cycles of the period t. The PWM signal S2 generated by the pulse width modulation amplifier 2 has fixed edges K that are phased-locked in synchronization with repeated cycles of the period t and a movable edge M that is position-modulated between these fixed edges in accordance with changes in the signal level of the analog signal S1. The PWM signal S3 is produced by phase inverting the PWM signal S2. The pulse width modulation amplifier 2 outputs the PWM signal S2 via the first signal output terminal 2b and the PWM signal S3 via the second signal output terminal 2c.

As a result, the signal phase of the PWM signal S2 has a complementary relationship with the signal phase of the PWM signal S3.

The PWM signal S2 that is outputted from the first signal output terminal 2b of the pulse width modulation amplifier 2 is supplied to the pre-driver 28 via the first input terminal 28a of the pre-driver 28, with the pre-driver 28 converting the PWM signal S2 into a signal S7 that can perform an ON/OFF driving of the first power FET 4. The PWM signal S3 that is outputted from the second signal output terminal 2c of the pulse width modulation amplifier 2 is supplied to the second input terminal 28b of the pre-driver 28, with the pre-driver 28 converting the PWM signal S3 into a signal S8 that can perform an ON/OFF driving of the second power FET 5.

The PWM signal S7 is supplied from the first signal output terminal 28c to the gate of the first power FET 4 while the PWM signal S8 is supplied from the second signal output terminal 28d to the gate of the second power FET 5. The first power FET 4 and the second power are switched ON and OFF in an alternate manner by these PWM signals S7 and S8, with a PWM power signal S4 that is generated with a movable edge M which is position modulated in accordance with changes in the movable edge M of the PWM signals S7 and S8 being outputted from between a connection node between the source of the first power FET 4 and the drain of the second power FET 5 and (b) a connection to ground.

The PWM power signal S4 is inputted into the LPF unit 6 that is composed of the coil 7 and the capacitor 8, and the LPF unit 6 demodulates the PWM power signal S4 to produce an analog power signal S5 that reflects the changes in the signal level of the analog signal S1, with the resulting analog power signal S5 being supplied, via the capacitor 13 for removing the DC component, to the input terminal 9a that is provided on the speaker unit 9 for the driving power signal. As a result, the analog power signal S5 is reproduced as an audio signal.

The following describes the position modulation of the movable edge M of the PWM power signal S4 by way of examples of the signal waveform of the PWM power signal S4 that are shown in FIG. 2A to FIG. 2D. As shown in FIG. 2C, the PWM power signal S4 has a one-sided PWM-modulated waveform. That is to say, both ends of this PWM-modulated waveform are phase-locked in synchronization with a cycle period t of the clock signal S6 (whose waveform is shown in FIG. 2D) as the fixed edges K, with the falling edge of the PWM-modulated waveform generated between these fixed edges K being a movable edge M which is position-modulated as shown by the arrow in FIG. 2C in accordance with changes in the signal level of the analog signal S1. A PWM power signal S4 with the PWM waveform described above is generated in every period t.

In more detail, the signal waveform of the PWM power signal S4 when the signal level of the analog signal S1 is zero becomes a PWM power signal waveform with a duty ratio of 50% as shown in FIG. 2A. When the signal level of the analog signal S1 has changed from zero in the direction where the level increases in the "+" direction, the movable edge M of the waveform of the PWM power signal S4 is position-modulated in the direction shown by the arrow in FIG. 2B. Conversely, when the signal level of the analog signal S1 has changed from zero in the direction where the level increases in the "−" direction, the movable edge M of the waveform of the PWM power signal S4 is position-modulated in the direction shown by the arrow in FIG. 2C.

Accordingly, when the movable edge M of the PWM power signal S4 has moved from the state shown in FIG. 2A in the direction shown in FIG. 2B or in FIG. 2C in accordance with a change in the signal level of the analog signal S1, the PWM power signal S4 is demodulated, via the LPF unit 6, as an analog power signal S5 that reflects the change in the signal level of the analog signal S1, and is then supplied, via the capacitor 13 for removing the DC component, to the speaker unit 9, where an audio signal that reflects the changes in the signal level of the analog signal S1 is reproduced.

The following is a detailed description of one embodiment of the control of the switching phase of a switching power supply unit according to the present invention, with reference to FIGS. 1A to 1H and FIG. 3. It should be noted that FIG. 3 is a circuit block diagram showing one example of the construction of the principal parts of the power supply clock signal generator 21 shown in FIG. 1.

First, the construction of the power supply clock signal generator 21 is described.

The power supply clock signal generator 21 is composed of a counter circuit 23, a coincidence detecting circuit 24, and a step-down circuit (frequency divider circuit) 25. A signal input terminal 23a of the counter circuit 23 is connected to the signal output terminal 10a that is provided on the master clock signal generator 10 for the first clock signal S15, a signal output terminal 23b that is provided in the counter circuit 23 for a BCD code data signal S16 is connected to a signal input terminal 24a that is provided on the coincidence detecting circuit 24 for the BCD code data signal S16, a signal output terminal 24b that is provided on the coincidence detecting circuit 24 for a coincidence pulse signal S17 is connected to a signal input terminal 25a that is provided in the step-down circuit 25 for the coincidence pulse signal S17, and a clock signal S18 for controlling the switching of the power supply is outputted from a signal output terminal 25b of the step-down circuit 25.

The following describes the operation of the power supply clock signal generator 21.

The first clock signal S15 (see FIG. 1D) that has been generated by the master clock signal generator 10 is inputted into the signal input terminal 23a of the counter circuit 23. The clock signal S6 (see FIG. 1B) is inputted into a reset terminal 23A of the counter circuit 23, and the counter circuit 23 counts the first clock signals S15, with the count value being reset whenever there is a clock signal S6. The counter circuit 23 outputs the count data from the signal output terminal 23b as the BCD (binary coded decimal) code data signal S16 (see FIG. 1E).

When, as one example, the maximum count value m of the counter circuit 23 is set so that m=100, BCD code data signals S16 that correspond to three decimal digits (the values "0" to "999") during the cycle period t of the clock signal S6 are successively outputted from the signal output terminal 23b of the counter circuit 23 and are inputted into a signal input terminal 24a of the coincidence detecting circuit 24.

On the other hand, reference BCD code data that is a predetermined number lower than the maximum value of the BCD code data for the cycle period t is inputted into a reference code input terminal 24A of the coincidence detecting circuit 24. The coincidence detecting circuit 24 compares the BCD code data signal S16 that has been inputted from the counter circuit 23 with this reference BCD code data and, when the codes in both sets of data match, outputs a coincidence pulse signal S17 (see FIG. 1F) from the signal output terminal 24b.

It should be noted that the reference BCD code data is selected at timing that is between the position of the movable edge M of the PWM power signal S4 when the degree of PWM modulation represents the maximum amplitude of the PWM power signal S4 and the fixed edge K (see FIG. 1C) that follows this movable edge M and is phase-locked in synchronization with the clock signal S6. Accordingly, as shown in FIG. 1F, the coincidence pulse signal S17 that is outputted from the coincidence detecting circuit 24 is outputted at timing that is between the position of the movable edge M that represents the maximum amplitude of the PWM power signal S4 and the following fixed edge K.

This coincidence pulse signal S17 is supplied to the signal input terminal 25a of the step-down circuit 25, and the step-down circuit 25 divides the frequency by n (where n is an integer), thereby generating a clock signal S18 (see FIG. 1G) with a frequency of several hundred KHz, for example, for controlling the switching of the power supply, the clock signal S18 being phased locked in synchronization with a rising edge of the coincidence pulse signal S17. The clock signal S18 is supplied from the signal output terminal 21c of the power supply clock signal generator 21 to the clock signal generating unit 19 of the switching power supply unit 11, with the clock signal generating unit 19 generating a switching signal S19 (see FIG. 1H) with a rising edge that is phase locked in synchronization with a rising edge A of this clock signal S18. Switching operations of the switching power supply unit 11 are performed in synchronization with this switching signal S19.

It should be noted that the period of the switching signal S19 may be an integral multiple of the clock signal S6. This is to say, even if the switching frequency of the switching power supply does not match the clock frequency of the pulse width modulation amplifier 2, a rising edge A of the switching signal S19 may still appear once in every n cycles of the clock signal S6.

In other words, the switching signal S19 has a cycle period that is n times the cycle period t of the PWM power signal S4 that is phase locked in synchronization with the clock signal S6, and is generated as a waveform that becomes ON at timing that is between the position of the movable edge M which shows the maximum amplitude of the PWM power signal S4 and the fixed edge K following this movable edge M. It should be noted that in this explanation, the switching power supply unit 11 shown in FIG. 1 has the same construction and the same operation as the switching power supply unit 11 shown in FIG. 8A, so that the explanation of the construction and operation of the switching power supply unit 11 shown in FIG. 8A also covers the switching power supply unit 11 shown in FIG. 4 and no further explanation will be given.

Due to the control of the switching phase according to an embodiment of the present invention that is shown in FIG. 1, a rising edge for the switching of the switching power supply unit 11 is controlled so as to rise at a position of the rising edge A (see FIG. 1G) of the clock signal S18. Accordingly, the timing at which the waveform of the switching signal S19 rises can be always matched with the timing at which the PWM power signal S4 obtained as the output of the power switching circuit 3 is at the ground level.

As a result, with the control of the switching phase according to the present embodiment of the present invention that is shown in FIG. 1, a significant reduction can be made in the effects of switching noise, which is generated when there is a rising edge in the switching waveform for the switching power supply unit 11, on the PWM power signal S4 that is obtained as the output of the power switching circuit 3, so that a reduction in the signal distortion rate can be achieved for the PWM power signal S4.

It should be noted that the BCD code data value that is inputted into the coincidence detecting circuit 24 as the reference data 24A is selected in accordance with the waveform characteristics and the crest value, etc., of the switching noise generated by the switching power supply unit 11.

It should also be noted that the arrow points in both directions for the switching signal S19 for the following reason. In the switching power supply unit 11, a voltage value of a DC voltage outputted by the power supply is supplied to the voltage error detecting unit 17. The voltage error detecting unit 17 compares this voltage value with a reference voltage value that is supplied to the voltage error detecting unit 17 by the reference voltage generating unit 18, and generates a voltage error signal which is fed back to the PWM switching unit 15. The arrow points in both directions to show that the PWM modulation of the switching signal S19 is controlled in the direction that cancels out the voltage error signal.

In the example described above, the clock signal S18 for controlling the switching of the power supply that is supplied to the switching power supply unit 11 is generated based on the clock signal S6 from the PWM clock signal generator 22, though if a relative positional relationship is maintained between the starting edges of both clock signals, a different construction may be used. As one example, control may be performed in the PWM clock signal generator 22 based on the clock signal S18 for controlling the switching of the power supply so that a starting edge of the clock signal S6 appears at a predetermined time lag after a starting edge of the clock signal S18.

Also, while a starting edge of the clock signal S6 was used in the above example as the reset signal (count starting signal) of the counter circuit 23 in the power supply clock signal generator 21, the movable edge M of the PWM power signal S4 or a signal (such as S2) that is based on the PWM power signal S4 may be used instead. In other words, in FIG. 1C, the counting of the master clock signals by the counter circuit 23 may start at a point when the movable edge M is detected, with a starting edge of the clock signal S18 for controlling the switching of the power supply being produced when the count has reached a preset number. In this case, the control becomes slightly more complicated than in the example described earlier, though there is the effect that the period of the clock signal S18 that is provided to the switching power supply unit 11 is not fixed and the frequency spectrum of the noise that is radiated by the switching power supply unit 11 is dispersed, so that the peak level within this spectrum is reduced.

Also, in the example described above, a time lag (phase lag) between the starting edges of the clock signal S6 and the clock signal S18 is controlled by the counter circuit 23 and the step-down circuit 25, though by setting the BCD code data that is set in the counter circuit 23 at a count value that corresponds to a period that is longer than one cycle of the clock signal S6, the step-down circuit 25 can be made unnecessary in the construction.

Figure 4:
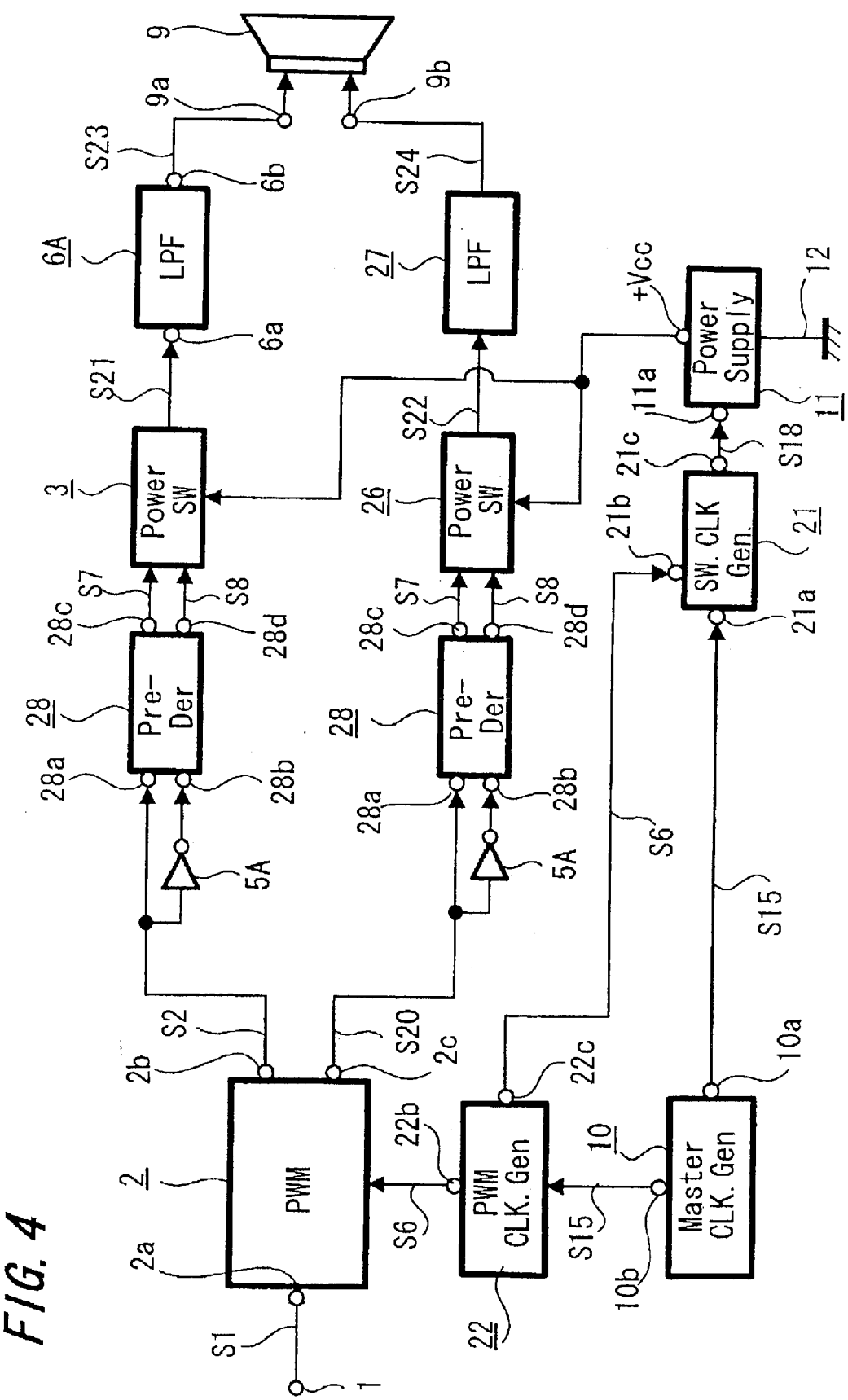
FIG. 4 is a diagram that is used to explain another example of a switching power amplifier according to the present invention.
Figure 5A:
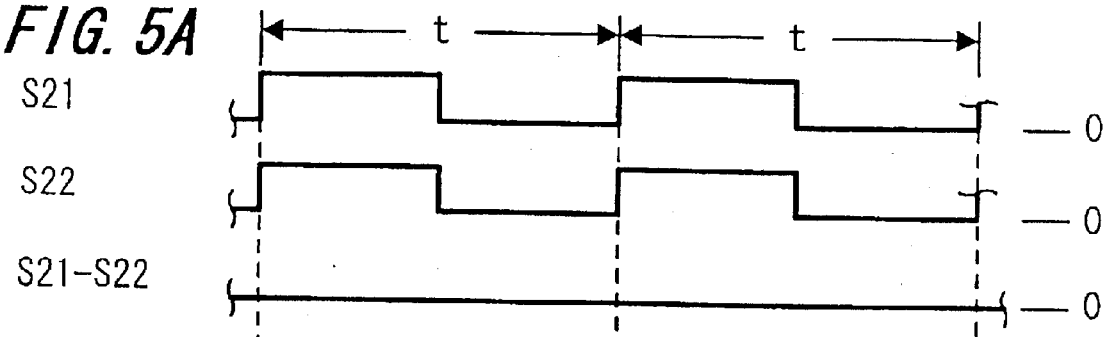
FIGS. 5A to 5C are diagrams that are used to explain the operation of this power amplifier.
Figure 5B:
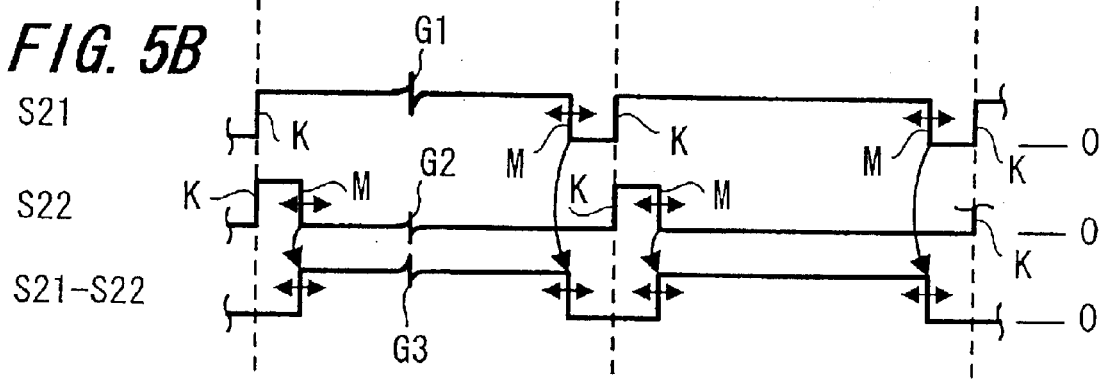
Figure 5C:
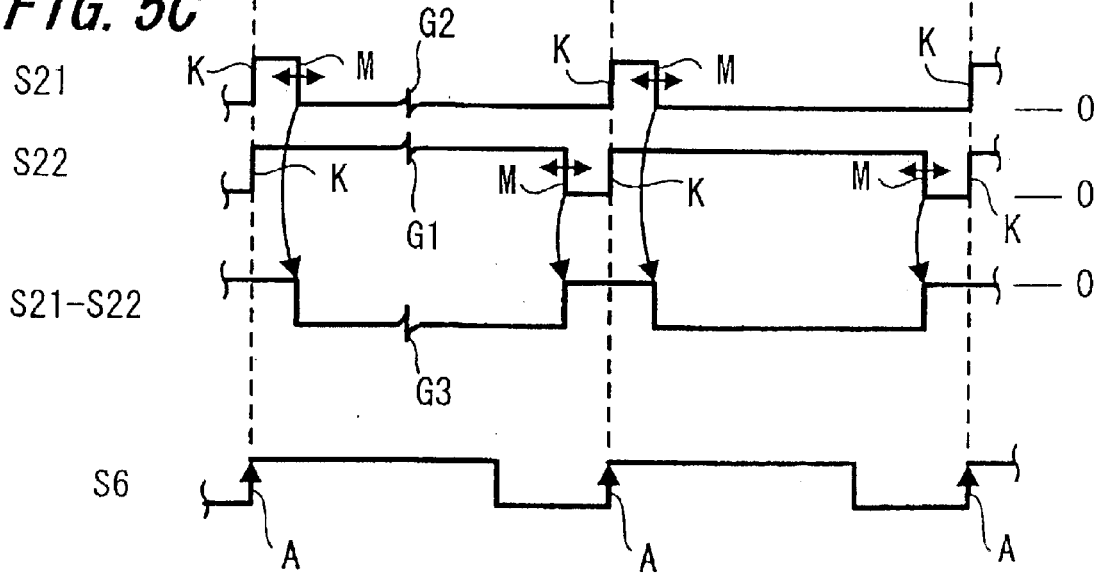
Figure 6:
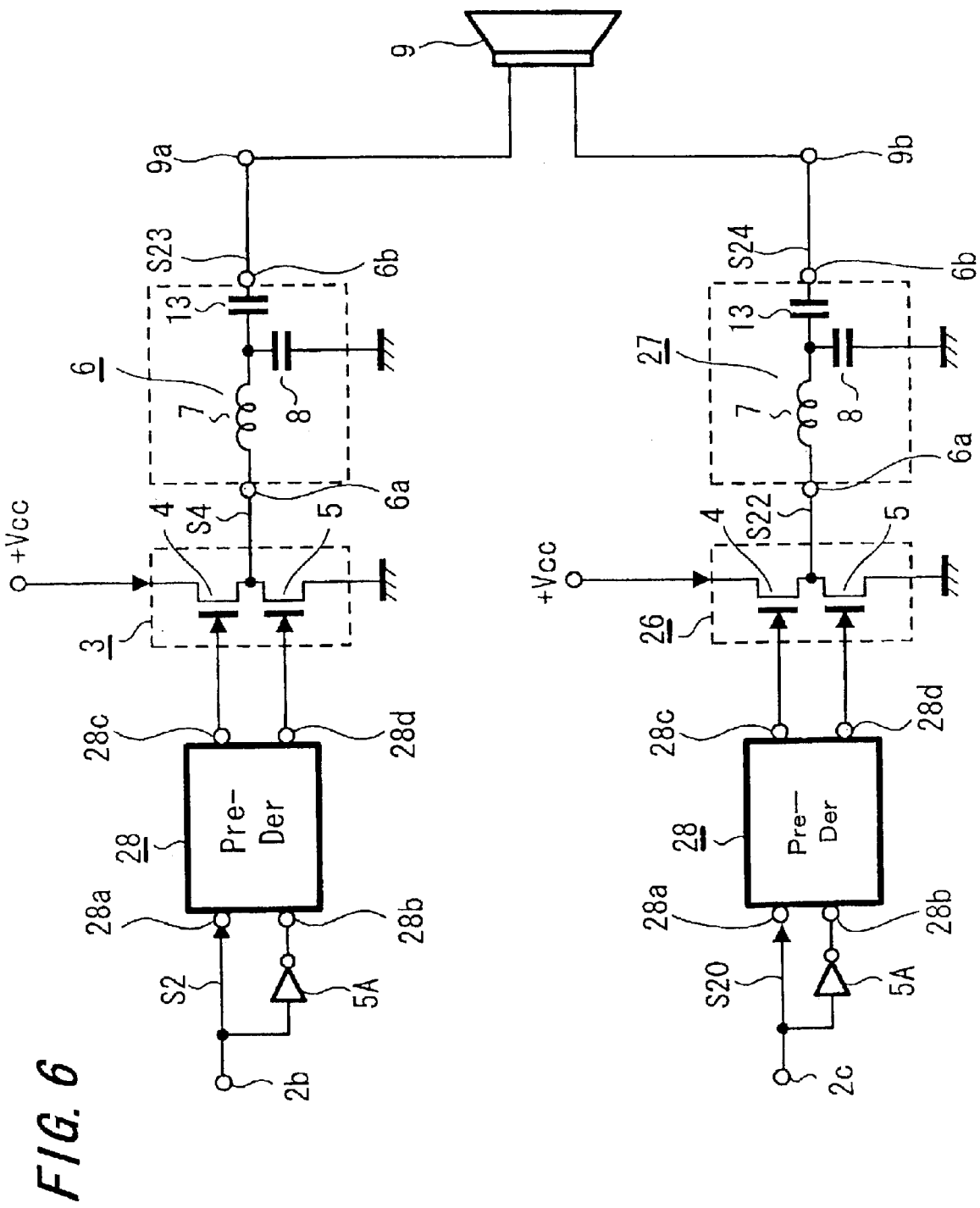
FIG. 6 is a diagram that is used to explain this other example of a switching power amplifier in more detail.
Figure 7A:
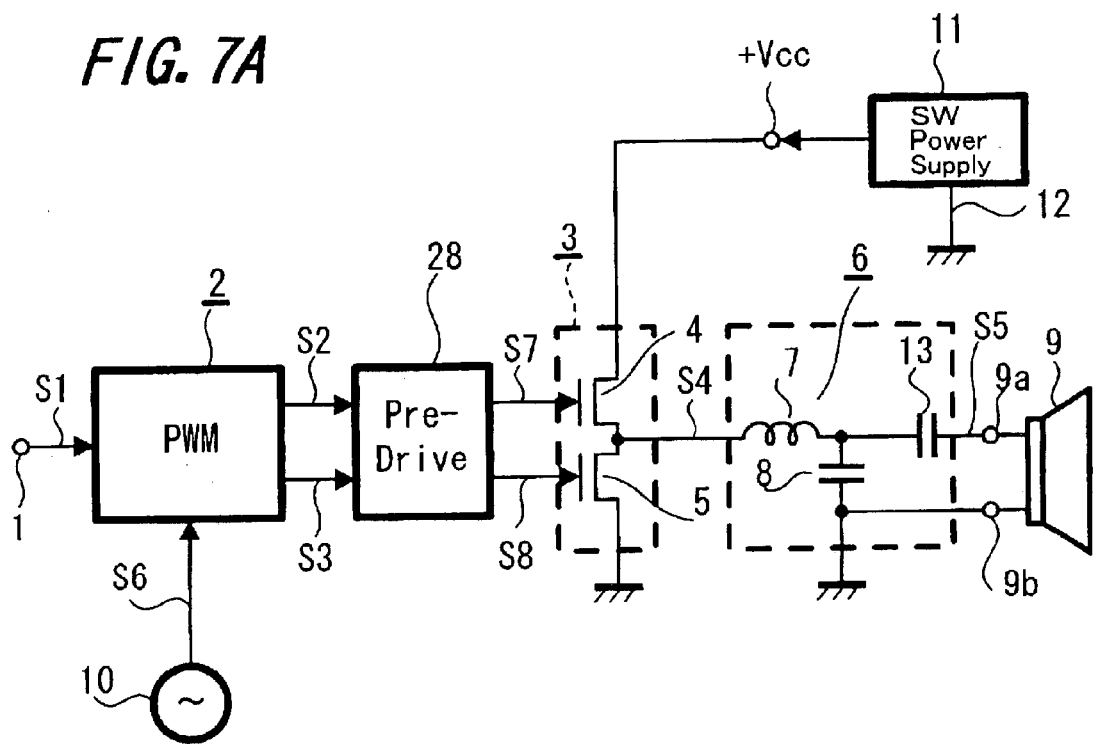
FIGS. 7A and 7B are diagrams that are used to explain the construction and operation of a conventional switching power amplifier.
Figure 7B:
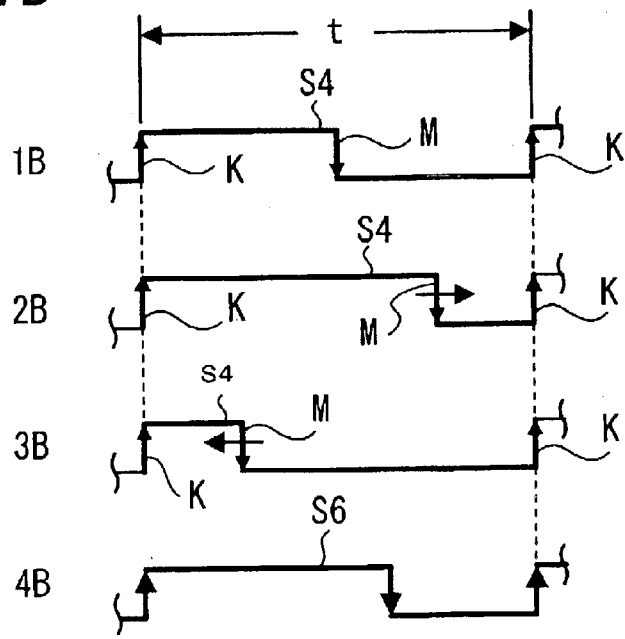
Figure 8A:
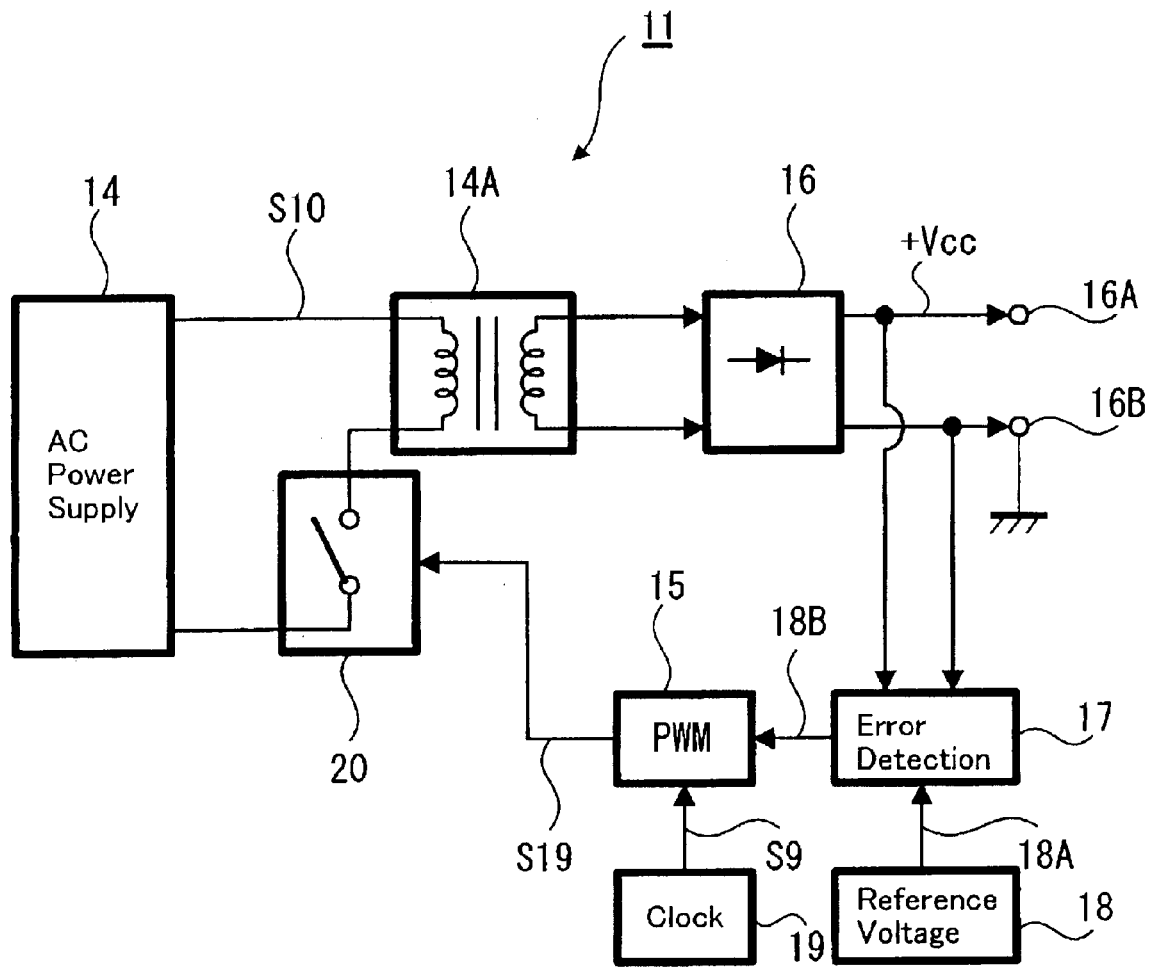
FIGS. 8A and 8B are diagrams that are used to explain the construction and operation of a conventional switching power supply.
Figure 8B:
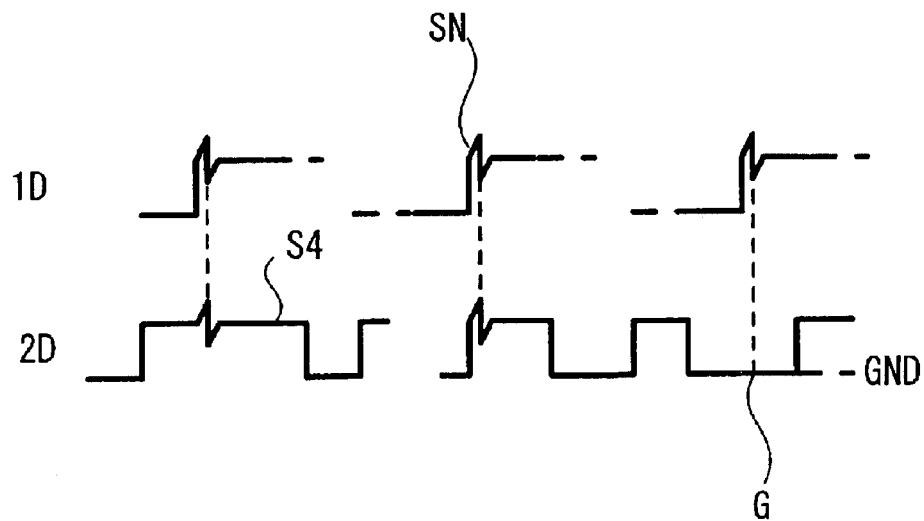

The following describes, with reference to FIGS. 4, 5 and 6, an example construction of a switching power amplifier that has a BTL (bridge tied load)-type class D-operation amplifier as another embodiment of the present invention. In this description, parts that are the same as in FIG. 1 have been given the same reference numerals and have not been described. It should be noted that in this explanation, the switching power supply unit 11 that is shown in FIG. 4 has the same construction and operation as the switching power supply unit 11 that is shown in FIG. 8A, so that the explanation of the construction and operation of the switching power supply unit 11 shown in FIG. 8A also covers the switching power supply unit 11 shown in FIG. 4 and no further explanation will be given.

The present class D-operation amplifier is composed of a pulse width modulation amplifier 2, a first power switching circuit 3, two inverters (both numbered 5A), a first LPF unit 6, a speaker unit 9, a master clock signal generator 10, a switching power supply unit 11, a power supply clock signal generator 21, a PWM clock signal generator 22, a second power switching circuit 26, a second LPF unit 27, and two pre-drivers (both numbered 28). In FIG. 4, numeral 1 is an input terminal for the analog signal S1.

The signal input terminal 1 is connected to a signal input terminal 2a of the pulse width modulation amplifier 2, a first output terminal 2b of the pulse width modulation amplifier 2 is connected to a first input terminal 28a of one of the pre-drivers 28, the first signal output terminal 2b is also connected via one of the inverters 5A to a second input terminal 28b of the same pre-driver 28, a first signal output terminal 28c of the pre-driver 28 is connected to the gate of the first power FET 4 of the power switching circuit 3, and a second signal output terminal 28d of the pre-driver 28 is connected to the gate of the second power FET 5.

A second signal output terminal 2c of the pulse width modulation amplifier 2 is connected to the first input terminal 28a of the other of the pre-drivers 28, the second signal output terminal 2c is also connected via one of the inverters 5A to the second input terminal 28b of this other pre-driver 28, a first signal output terminal 28c of this pre-driver 28 is connected to the gate of the first power FET 4 of the power switching circuit 26, and the second signal output terminal 28d of the pre-driver 28 is connected to the gate of the second power FET 5 of the second power switching circuit 26.

The source of the first power FET 4 of the power switching circuit 3 is connected to the drain of the second power FET 5, the drain of the first power FET 4 is connected to the "+" DC power supply terminal +Vcc of the switching power supply unit 11, and the source of the second power FET 5 is connected to ground. A serial connection node in the power switching circuit 3 between the source of the first power FET 4 and the drain of the second power FET 5 is connected to an input terminal 6a of the first LPF unit 6, and an output terminal 6b of the first LPF unit 6 is connected to an input terminal 9a provided on the speaker unit 9 for a driving power signal.

The source of the first power FET 4 of the power switching circuit 26 is connected to the drain of the second power FET 5, the drain of the first power FET 4 is connected to the "+" DC power supply terminal +Vcc of the switching power supply unit 11, and the source of the second power FET 5 is connected to ground. A serial connection node in the power switching circuit 26 between the source of the first power FET 4 and the drain of the second power FET 5 is connected to an input terminal 6a of the second LPF unit 27, and an output terminal 6b of the second LPF unit 27 is connected to an input terminal 9b provided on the speaker unit 9 for a driving power signal. It should be noted that the internal construction and the operation of this second LPF unit 27 are the same as those of the first LPF unit 6, so that the components of the second LPF unit 27 have been given the same reference numerals as the first LPF unit 6 and are not described in detail.

The following describes the operation of a switching power amplifier that is constructed with a BTL type class D-operation amplifier.

The analog signal S1 that is inputted into the signal input terminal 1 of this class D-operation amplifier is inputted into the pulse width modulation amplifier 2. The pulse width modulation amplifier 2 generates a first PWM signal S2 that is pulse width modulated in accordance with the signal level of this analog signal S1 and a second PWM signal S20 that is pulse width modulated in accordance with the signal level of this analog signal S1 so that the PWM signal S20 is a two's complement of the first PWM signal S2.

It should be noted that the first PWM signal S2 is a PWM signal with a waveform with fixed edges K that are phase locked in synchronization with each cycle of a clock signal S6 that has the fixed cycle period t and a movable edge M that is position modulated so that the position of the movable edge M between a pair of adjacent fixed edges K changes in accordance with changes in the signal level of the analog signal S1. The second PWM signal S20 is a waveform that is a two's complement of the waveform of the first PWM signal S2, and is a PWM signal with a waveform with fixed edges K that are phase locked in synchronization with each cycle of a clock signal S6 that has the fixed cycle period t and a movable edge M that is position modulated so that the position of the movable edge M between a pair of adjacent fixed edges K changes in accordance with changes in the signal level of the analog signal S1.

The first PWM signal S2 is supplied via one of the pre-drivers 28 to the gate of the first power FET 4 of the first power switching circuit 3 and controls the switching of the first power FET 4. A signal produced by phase-inverting the PWM signal S2 using the inverter 5A is supplied via the same pre-driver 28 to the gate of the second power FET 5 in the first power switching circuit 3 and controls the switching of the second power FET 5. In this way, the first PWM power signal S21 is generated.

This first PWM power signal S21 is supplied to the first LPF unit 6 that has suitable frequency characteristics for removing a carrier signal component of the first PWM power signal S21. Once the carrier signal component of the first PWM power signal S21 has been removed by the first LPF unit 6, the resulting first analog power signal S23 that reflects the changes in the signal level of the analog signal S1 is supplied to the input terminal 9a of the speaker unit 9 via the capacitor 13 for removing the DC component.

The second PWM signal S20 that is the two's complement of the PWM signal S2 is supplied to the gate of the first power FET 4 in the second power switching circuit 26 and controls the switching of the first power FET 4. A signal produced by phase-inverting the second PWM signal S20 using the inverter 5A is supplied via the second pre-driver 28 to the gate of the second power FET 5 in the second power switching circuit 26 and controls the switching of the second power FET 5. In this way, the second PWM power signal S22 is generated.

As a result, the time between a fixed edge K in the first PWM power signal S21 and the following movable edge M is equal to the time between the movable edge M in the second PWM power signal S22 and the following fixed edge K.

The second PWM power signal S22 is supplied to the second LPF unit 27 that has suitable frequency characteristics for removing a carrier signal component of the second PWM power signal S22. Once the carrier signal component of the second PWM power signal S22 has been removed by the second LPF unit 27, the resulting second analog power signal S24 that reflects the changes in the signal level of the analog signal S1 is supplied to the input terminal 9b of the speaker unit 9 via the capacitor 13 for removing the DC component. It should be noted that the two's complement relationship is maintained between the first analog power signal S23 and the second analog power signal S24.

Accordingly, the speaker unit 9 is differentially driven by the first analog power signal S23 and the second analog power signal S24, so that an audio signal that reflects the analog signal S1 is reproduced.

The following describes how the load is driven for the BTL-connected circuit that is shown in FIG. 4 and FIG. 6. In this BTL-connected circuit, the load is composed of the LPF unit 6, the speaker unit 9, and the second LPF unit 27, which are connected in series. This BTL-connected circuit is constructed with the load connected between the outputs of the first power switching circuit 3 and the second power switching circuit 26. Timing charts for each of the first PWM power signal S21 and the second PWM power signal S22 that are provided to the load are shown in FIG. 5A to 5C.

It should be noted that the directions shown by the bidirectional arrows in each of FIGS. 5A to 5C show the directions in which the signal waveforms change in accordance with changes in the signal level of the analog signal S1, and the symbol t shows the cycle period t of the clock signal S6 generated by the master clock signal generator 10, with the cycle period t normally being fixed. The respective rising edges of the first PWM power signal S21 and the second PWM power signal S22 are the fixed edges K that are phase-locked in synchronization with the clock signal S6.

FIG. 5A shows the respective signal waveforms of the first PWM power signal S21 and the second PWM power signal S22 when the signal level of the analog signal S1 inputted into the signal input terminal 1 is zero. In this case, the difference (S21–S22) between the first PWM power signal S21 and the second PWM power signal S22 is zero as shown in FIG. 5A, so that the power provided to the load side is also zero.

FIG. 5B is a timing chart showing an example case where the signal amplitude level of the analog signal S1 changes from zero in the "+" direction. As should be clear from FIG. 5B, the power signal (S21–S22) for the difference between the first PWM power signal S21 and the second PWM power signal S22 that are both one-sided PWM waveform signals is such that the signal waveform changes in mutually opposite directions in accordance with the changes in the signal level of the analog signal S1, with the waveform signal width on both left and right sides of a position (t/2) that is central for the waveform of this signal (S21–S22) being symmetrical. The difference signal (S21–S22) is also a two-sided PWM modulated waveform with a crest value that is maintained on the "+" side.

FIG. 5C is a timing chart showing an example case where the signal amplitude level of the analog signal S1 changes from zero in the "−" direction. As should be clear from FIG. 5C, the power signal (S21–S22) for the difference between the first PWM power signal S21 and the second PWM power signal S22 that are both one-sided PWM waveform signals is such that the signal waveform changes in mutually opposite directions in accordance with the changes in the signal level analog signal S1, with the waveform signal width on both left and right sides of a position (t/2) that is central for the waveform of this signal (S21–S22) being symmetrical. The difference signal (S21–S22) is also a two-sided PWM modulated waveform with a crest value that is maintained on the "−" side.

Accordingly, with the embodiment shown in FIG. 4, an output PWM wave that is properly symmetrical is obtained when the signal level of the analog signal S1 is in the positive region or the negative region, so that no secondary distortion due to the PWM modulation is generated in the output signal in the audible frequency range that is supplied to the load side composed of the first LPF unit 6 and the second LPF unit 27 (and, in the present example, the speaker unit 9).

On the other hand, if a switching noise disturbance is caused by the switching power supply unit 11 for each of the first PWM power signal S21 and the second PWM power signal S22 while one of the first PWM power signal S21 and the second PWM power signal S22 is ON and the other is OFF, the grounding reactance value for the PWM power signal that is OFF is extremely low compared to the grounding reactance value for the PWM power signal that is ON, so that as shown by G1 and G2 in FIG. 5B and FIG. 5C, the balance between the switching noise disturbance level G1 that is generated for the PWM output signal that is ON and the switching noise disturbance level G2 that is generated for the PWM output signal that is OFF is destroyed.

As a result, as shown by G3 in FIG. 5B and FIG. 5C, the noise disturbance level G3 is left in the PWM output signal (the first PWM power signal S21 minus the second PWM power signal S22), so that there is the problem of signal distortion being generated in the output signal (S23–S24) that drives the speaker unit 9.

However, with a switching power amplifier constructed using the BTL-type class D-operation amplifier shown in FIGS. 4 to 6, as shown in FIG. 4, a power supply clock signal generator 21 for generating the clock signal S18 for controlling the switching of the power supply is provided in the same way as in the switching power amplifier shown in FIGS. 1 to 3. Based on the clock signal S18 outputted by the power supply clock signal generator 21, the position of the rising edge of the waveform of the switching signal S19 of the switching power supply unit 11 is also set in a range during which both the first PWM power signal S21 and the second PWM power signal S22 shown in FIGS. 5A to 5C are at the ground level. It should be noted that the construction and operation of the present power supply clock signal generator 21 are the same as those of the power supply clock signal generator 21 shown in FIG. 8A, so that the explanation of the construction and operation of the power supply clock signal generator 21 shown in FIG. 8A also covers the present power supply clock signal generator 21 and no further explanation will be given.

It should be noted that in the present embodiment, the reference BCD code data is not restricted to being set so that the position of the rising edge of the waveform of the switching signal S19 of the switching power supply unit 11 is in a range during which both the first PWM power signal S21 and the second PWM power signal S22 shown in FIGS. 5A to 5C are at the ground level. It should be obvious that the reference BCD code data may be set so that the rising edge of the waveform of the switching signal S19 of the switching power supply unit 11 is in a range during which both the first PWM power signal S21 and the second PWM power signal S22 shown in FIG. 5B are at the power supply +Vcc level. In other words, even if both the first PWM power signal S21 and the second PWM power signal S22 are subject to switching noise when the rising edge of the switching signal S19 is in a range during which both the first PWM power signal S21 and the second PWM power signal S22 are at the DC power supply terminal +Vcc voltage, the present embodiment is a BTL-type switching power amplifier, so that the switching noise in one of the signals cancels out the switching noise in the other. As a result, the switching noise does not appear in the differential output.

Accordingly, with the BTL-type switching power amplifier of the present embodiment which is shown in FIGS. 4 to 6 and uses PWM power signals S21 and S22 that are a two's complement of each other, it is possible to significantly reduce the effect of switching noise (which occurs when the switching waveform of the switching power supply unit 11 rises) on the output (S21–S22) that is the difference between the PWM power signals S21 and S22 that are obtained as the respective outputs of the power switching circuits 3 and 26. As a result, the signal distortion ratio of the PWM output signal obtained as the difference between these signals can be reduced.

It should be noted that the value of the BCD code data used as the reference data 24A may be set in accordance with the waveform characteristics, crest value, etc., of the switching noise in the same way as in the embodiment shown in FIGS. 1 to 3.

The embodiments of the present invention describe a case where a speaker unit is used as the load to be driven, though the present invention is not restricted to this case. It should be obvious that the present invention may be widely adapted to a switching power amplifier with a switching power supply that is used in cases where a variable driving power signal is supplied to a load, such as a precision motor that needs to rotate smoothly and quietly, where distortion in the current waveform and/or in the voltage waveform of the driving signal provided to the load causes problems.

What is claimed is:
1. A switching power amplifier, comprising:
  pulse width modulation converting means for performing a conversion of an input signal into a pulse width modulation signal;

pulse width modulation clock signal generating means for generating a first clock signal that has a reference period for conversion of the input signal into the pulse width modulation signal and supplying the first clock signal to the pulse width modulation converting means, so that a timing of a fixed edge of the pulse width modulation signal is based on the first clock signal;

power switching means controlled by the pulse width modulation signal;

a switching power supply unit for supplying power to the power switching means; and power supply clock signal generating means for generating a second clock signal based on the first clock signal that has a reference period for switching operations of the switching power supply unit and supplying the second clock signal to the switching power supply unit, wherein a starting edge of the second clock signal that is generated by the power supply clock signal generating means is formed during a period between the fixed edge of the pulse width modulation signal and a moveable edge that follows the fixed edge.

2. The switching power amplifier according to claim 1, wherein the second clock signal generated by the power supply clock signal generating means is generated in synchronization with the first clock signal generated by the pulse width modulation clock signal generating means.

3. The switching power amplifier according to claim 2, wherein the power supply clock signal generating means forms a starting edge of the second clock signal a predetermined time after detecting a starting edge in the first clock signal generated by the pulse width modulation clock signal generating means.

4. The switching power amplifier according to claim 1, wherein the first clock signal generated by the pulse width modulation clock signal generating means is generated in synchronization with the second clock signal generated by the power supply clock signal generating means.

5. The switching power amplifier according to claim 4, wherein the pulse width modulation clock signal generating means forms a starting edge of the first clock signal a predetermined time after detecting a starting edge in the second clock signal generated by the power supply clock signal generating means.

6. The switching power amplifier according to claim 1, wherein the starting edge of the second clock signal generated by the power supply clock signal generating means is formed between a movable edge of the pulse width modulation signal for a case of maximum modulation of the pulse width modulation signal and a fixed edge that follows the movable edge.

7. The switching power amplifier according to claim 1, wherein the power supply clock signal generating means forms a starting edge of the second clock signal a predetermined time after detecting a movable edge of the pulse width modulation signal.

8. The switching power amplifier according to claim 1, wherein a period of the second clock signal generated by the power supply clock signal generating means is n times a period of the first clock signal generated by the pulse width modulation clock signal generating means, n being an integer that is 1 or greater.

9. The switching power amplifier according to claim 1, further comprising master clock signal generating means for generating a master clock signal supplied to pulse width modulation clock signal generating means and to the power supply clock signal generating means as a reference clock signal, the master clock signal having a period that is 1/m in of a period of the first clock signal, in being an integer that is 1 or greater.

10. A switching control method for a switching power amplifier that includes a pulse width modulation converting unit receiving an input signal and a switching power supply unit, comprising a step of controlling a second clock signal that is based on a clock signal of the pulse width modulation converting unit, which has a reference period for switching operations of the switching power supply unit, so that a starting edge of the second clock signal is formed between a fixed edge of a pulse width modulation signal formed from the input signal and a moveable edge that follows the fixed edge.

11. A switching control method for a switching power amplifier that includes a pulse width modulation converting unit receiving an input signal and a switching power supply unit, comprising a step of controlling the switching power supply unit so that a starting edge of a second clock signal that is based on a first clock signal of the pulse width modulation converting unit, which has a reference period for switching operations of the switching power supply unit, is formed between a fixed edge of a pulse width modulation signal formed from the input signal for a case of maximum modulation of the pulse width modulation signal and a moveable edge that follows the fixed edge.

12. A switching power amplifier, comprising:

pulse width modulation converting means for performing a conversion of an input signal into a first pulse width modulation signal and a second pulse width modulation signal, the first pulse width modulation signal and the second pulse width modulation signal being a two's complement of each other;

pulse width modulation clock signal generating means for generating a first clock signal that has a reference period fed to the pulse width modulation converting means for controlling a timing of converting the input signal into the first pulse width modulation signal and the second pulse width modulation signal and supplying the first clock signal to the pulse width modulation converting means;

first power switching means controlled by the first pulse width modulation signal;

second power switching means controlled by the first pulse width modulation signal;

a switching power supply unit for supplying power to the first power switching means and the second power switching means; and power supply clock signal generating means for generating a second clock signal based on the first clock signal that has a reference period for switching operations of the switching power supply unit and supplying the second clock signal to the switching power supply unit, wherein a starting edge of the second clock signal that is generated by the power supply clock signal generating means and that is based on the first clock signal is formed during a period where the first pulse width modulation signal and the second pulse width modulation signal have an equal potential level.

13. The switching power amplifier according to claim 12, wherein
a starting edge of the second clock signal generated by the power supply clock signal generating means is formed during one of:
a first period between a fixed edge of the first pulse width modulation signal and a moveable edge that follows the fixed edge; and
a second period between a movable edge of the first pulse width modulation signal and a fixed edge that precedes the movable edge.

14. The switching power amplifier according to claim 12, wherein
the second clock signal generated by the power supply clock signal generating means is generated in synchronization with the first clock signal generated by the pulse width modulation clock signal generating means.

15. The switching power amplifier according to claim 14, wherein
the power supply clock signal generating means forms a starting edge of the second clock signal a predetermined time after detecting a starting edge in the first clock signal generated by the pulse width modulation clock signal generating means.

16. The switching power amplifier according to claim 12, wherein
the first clock signal generated by the pulse width modulation clock signal generating means is generated in synchronization with the second clock signal generated by the power supply clock signal generating means.

17. The switching power amplifier according to claim 16, wherein
the pulse width modulation clock signal generating means forms a starting edge of the first clock signal a predetermined time after detecting a starting edge in the second clock signal generated by the power supply clock signal generating means.

18. The switching power amplifier according to claim 12, wherein
a starting edge of the second clock signal generated by the power supply clock signal generating means is formed during one of:
a first period between a fixed edge of the first pulse width modulation signal for a case of maximum modulation of the first pulse width modulation signal and a moveable edge that follows the fixed edge; and
a second period between a movable edge of the first pulse width modulation signal for a case of minimum modulation of the first pulse width modulation signal and a fixed edge that precedes the movable edge.

19. The switching power amplifier according to claim 12, wherein the power supply clock generating means forms a starting edge of the second clock signal a predetermined time after detecting a movable edge in the first pulse width modulation signal.

20. The switching power amplifier according to claim 12, wherein
a period of the second clock signal generated by the power supply clock signal generating means is n times a period of the first clock signal generated by the pulse width modulation clock signal generating means, n being an integer that is 1 or greater.

21. The switching power amplifier according to claim 12, further comprising master clock signal generating means for generating a master clock signal supplied to the pulse width modulation clock signal generating means and to the power supply clock signal generating means as a reference clock signal, the master clock signal having a period that is 1/m of a period of the first clock signal, m being an integer that is 1 or greater.

22. A switching control method for a switching power amplifier that includes a pulse width modulation converting unit receiving an input signal a switching power supply unit,
comprising a step of controlling a second clock signal, which has a reference period for switching operations of the switching power supply unit and which is based on a first clock signal of the pulse width modulation converting unit, so that a starting edge of the second clock signal is formed during one of:
a first period between a moveable edge of a first pulse width modulation signal that is formed from the input signal and a fixed edge that precedes the movable edge; and
a second period between a movable edge of a second pulse width modulation signal that is a two's complement of the first pulse width modulation signal and a fixed edge that precedes the movable edge.

23. A switching control method for a switching power amplifier that includes a pulse width modulation converting unit receiving an input signal and a switching power supply unit,
comprising a step of controlling a second clock signal, which has a reference period for switching operations of the switching power supply unit and which is based on a first clock signal of the pulse width modulation converting unit, so that a starting edge of the second clock signal is formed during one of:
a first period between a movable edge of a first pulse width modulation signal that is formed from the input signal for a case of maximum modulation of the first pulse width modulation signal and a fixed edge that precedes the movable edge; and
a second period between a movable edge of a second pulse width modulation signal that is a two's complement of the first pulse width modulation signal for a case of maximum modulation of the second pulse width modulation signal and that precedes the movable edge.

* * * * *